Aug. 27, 1968 H. H. UNFRIED 3,398,758

PURE FLUID ACOUSTIC AMPLIFIER HAVING BROAD BAND FREQUENCY CAPABILITIES

Filed Sept. 30, 1965 9 Sheets-Sheet 1

INVENTOR

HAPPY HUGH UNFRIED

BY Herzig, Walsh & Blackham

ATTORNEYS

INVENTOR
HAPPY HUGH UNFRIED

BY Herzig, Walsh & Blackham
ATTORNEYS

INVENTOR
HAPPY HUGH UNFRIED

BY Herzig, Walsh & Blackham
ATTORNEYS

INVENTOR
HAPPY HUGH UNFRIED

BY Herzig, Walsh + Blackham
ATTORNEYS

INVENTOR
HAPPY HUGH UNFRIED

BY Herzig, Walsh & Blackham
ATTORNEYS

Aug. 27, 1968 H. H. UNFRIED 3,398,758
PURE FLUID ACOUSTIC AMPLIFIER HAVING BROAD
BAND FREQUENCY CAPABILITIES
Filed Sept. 30, 1965 9 Sheets-Sheet 6

INVENTOR
HAPPY HUGH UNFRIED

BY Herzig, Walsh & Blackham
ATTORNEYS

INVENTOR
HAPPY HUGH UNFRIED
BY
Herzig, Walsh & Blackham
ATTORNEYS

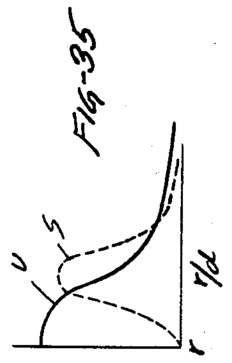
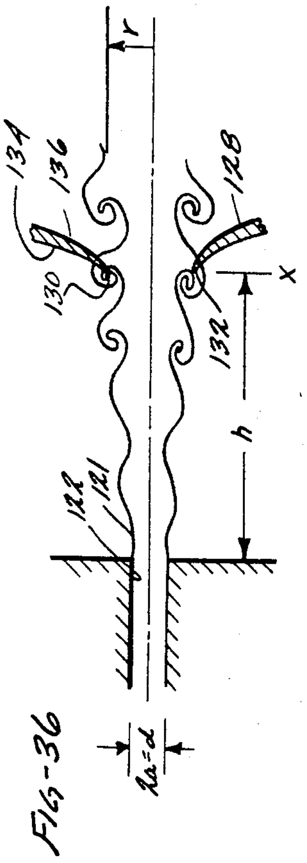
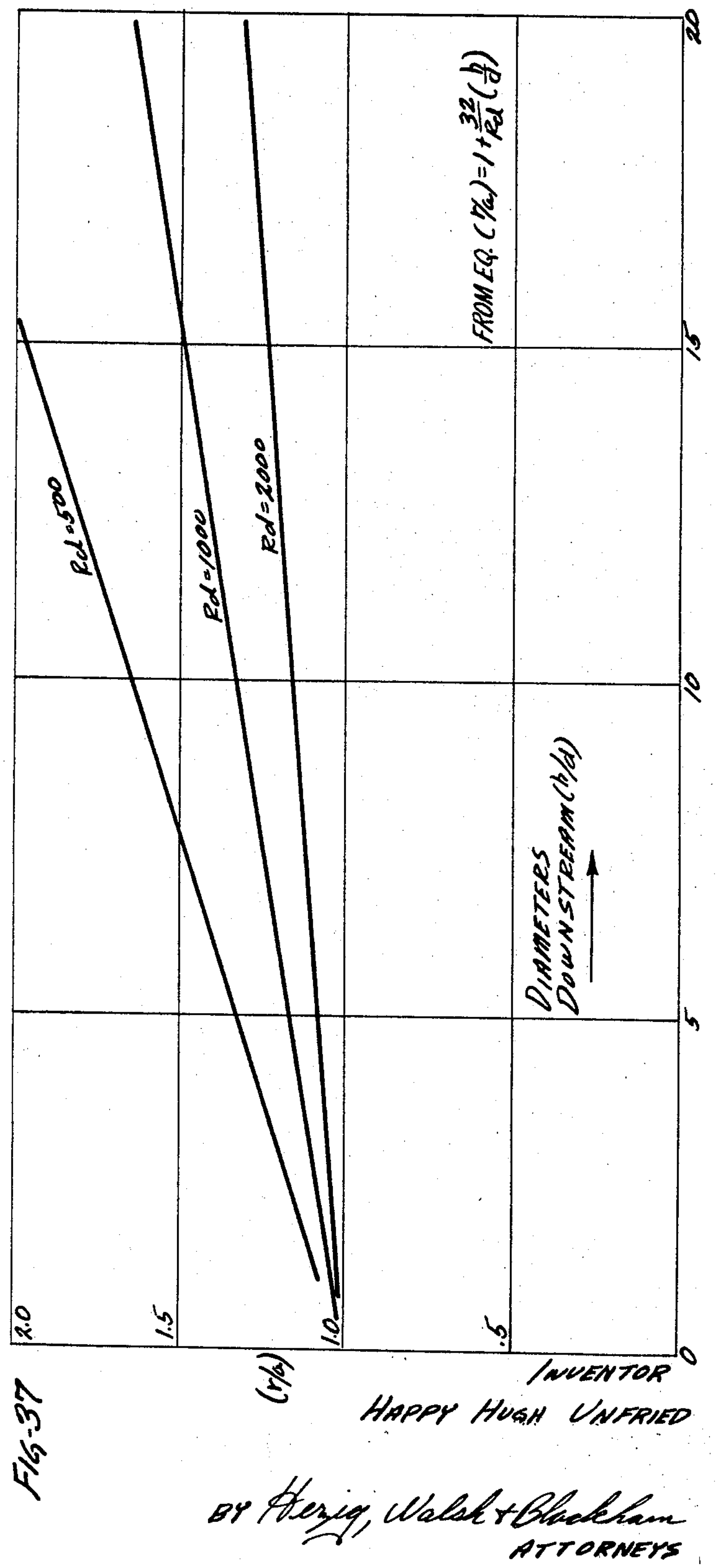
INVENTOR
HAPPY HUGH UNFRIED
BY Herzig, Walsh & Blackham
ATTORNEYS INVENTOR
HAPPY HUGH UNFRIED
BY Herzig, Walsh & Blackham
ATTORNEYS United States Patent Office 3,398,758
Patented Aug. 27, 1968

3,398,758
PURE FLUID ACOUSTIC AMPLIFIER HAVING BROAD BAND FREQUENCY CAPABILITIES

Happy Hugh Unfried, Los Angeles, Calif., assignor to Mattel, Inc., Hawthorne, Calif., a corporation of California Filed Sept. 30, 1965, Ser. No. 491,724
21 Claims. (Cl. 137—81.5)

ABSTRACT OF THE DISCLOSURE

A pure fluid acoustic amplifier, transmitter and communication device is provided comprising means for generating a sound-sensitive free jet discharging into an ambient fluid, means for modulating the jet acoustically, oscillator means for obtaining an elastic carrier wave from the modulated free jet, means for transmitting the modulated elastic carrier wave in the ambient fluid toward a demodulator and means for receiving the transmitted carrier wave and demodulating it, thereby generating a reproduction of the original input acoustic signal. A modified form of the device includes means for establishing controlled negative or positive acoustic feedback, thereby allowing special control features.

The present invention relates to a pure fluid acoustic amplifier having broad band frequency capabilities and more particularly to a pure fluid acoustic modulated carrier amplifier and communication device.

As used herein the term "pure fluid device" shall mean a device without moving parts other than the working medium in which an output is obtained in the form of a signal or the like by fluid interaction; the term "pure fluid acoustic amplifier" shall mean a pure fluid device whose input and output signals are acoustic so that there is no net mass flow of fluid associated with the input or the amplified output signal although the energy utilized to amplify the signal was derived from fluid energy supplied to the device; the term "free jet" shall mean a fluid stream which is unattached to any boundaries; the term "sound-sensitive jet" shall mean a fluid stream the flow pattern or streamlines of which may be disturbed by sound; and the terms "hydrodynamic oscillator" and "hydrodynamic traveling wave amplifier with positive feedback" shall each mean a device which produces a pulsing mass flow rate of a fluid, the natural product of which is a radiated sound which shall be referred to herein as a "carrier."

Pure fluid amplifiers are known. These devices generally employ no moving parts other than a stream of fluid which may be selectively switched to different output channels by other control fluid streams which interact at right angles with the stream to be switched. Pure fluid amplifiers have been developed in which a control stream of relatively low energy is used to deflect a power stream of relatively high energy. When compared with electronic devices, such amplifiers are slow to respond and have very low bandwidths. As stated in the Dec. 17, 1964 issue of Design Abstracts, " . . . band widths greater than 1,000 cycles are not likely in the near future. Ten thousand cycles may never be reached." The device of the present invention, on the other hand, comprises a pure fluid acoustic amplifier having broad band frequency capabilities which has demonstrated operation over a 10,000 cycle bandwidth and theoretically the device can have much broader bandwidths. The device of the present invention accepts only sound waves as the input signal and the output is a reproduction of the input sound. Signals with a net mass flow (averaged over a single cycle) will not be amplified. Hence, this device does not have zero frequency response as do all other known fluid amplifiers.

Prior art communication devices employing electronic amplifiers are known wherein an audio input modulates a carrier wave electronically and an audio output is obtained by demodulating the carrier wave electronically. The device of the present invention, on the other hand, accomplishes both of these functions non-electronically by employing pure fluid devices. Also, prior art fluid amplifiers lack modulated carrier systems because of the absence of a nonlinear process for demodulation. The present invention, on the other hand, provides a new and useful fluid jet demodulator employing a nonlinear demodulation process.

Although the general philosophy utilized in the modulated carrier amplifier of the present invention is similar to that used in radio communication, the fluid system elements are not entirely analogous with their electronic counterparts. An alternative view of the system is one employing conjugate jets which are individually operated in a highly non-linear region of flow (also novel in the art of fluid amplifiers). The jets' characteristics suitably complement each other to allow a quasi-linear response. A system of this sort inherently possesses the capabilities of high gain and broad bandwidth.

Accordingly, it is a primary object of the present invention to provide a new and useful pure fluid acoustic amplifier and communication device.

It is another object of the present invention to provide a new and useful non-electronic communication system.

Yet another object of the present invention is to provide a new and useful pure fluid amplifier having broad band frequency capabilities.

Another object of the present invention is to provide a pure fluid acoustic modulated carrier amplifier which employs negative acoustic feedback, thereby providing substantially constant gain over a broad frequency range.

A further object of this invention is to utilize acoustic negative feedback to provide a pure fluid acoustic amplifier which has substantially constant gain with slow time variations of the required fluid supply pressure.

Yet another object of the present invention is to provide a device which uses acoustic positive feedback to enhance the frequency selectivity, thereby reducing the bandwidth while increasing the gain of a pure fluid acoustic amplifier.

A still further object of the present invention is to provide pure fluid means for demodulating a carrier wave to obtain an audio output therefrom.

Another object of the present invention is to provide a new and useful modulator for producing a speech modulated air jet stream and for oscillating said stream at either an inaudible frequency or an audible frequency to produce a speech-modulated carrier wave.

An additional object of this invention is to provide acoustic resonant means for stabilizing the acoustic carrier frequency and thereby increasing the efficiency of the fluid modulator incorporated in the acoustic fluid amplifier system.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which like reference numerals refer to like elements in the several views.

In the drawings:

FIGURE 35 is a graphical representation of the velocity and vorticity profiles for a circular jet;

FIGURE 36 is a diagrammatic representation showing the use of a flow divider plate for demodulation purposes;

FIGURE 37 is a graphical illustration of the disposition of a flow divider plate used for demodulation purposes;

Figure 1:
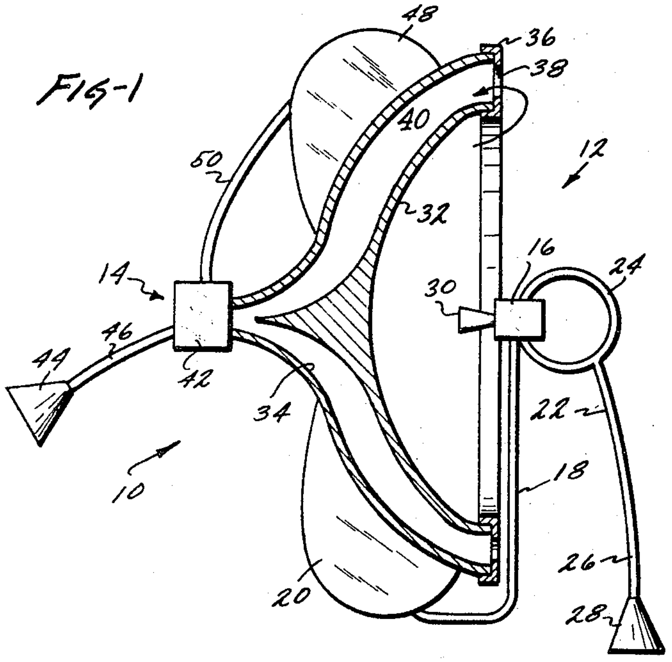
FIGURE 1 is a cross-sectional view of a combined transmitter receiver which may be used in a communication system of the present invention.
Figure 3:
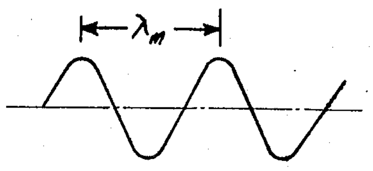
FIGURES 3 and 4 are diagrams of a single-tone audio input into the amplifier of FIGURE 2.
Figure 4:
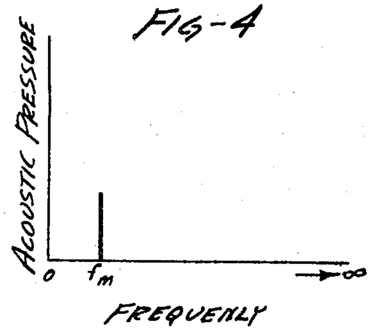

Referring again to the drawings and particularly to FIGURE 1, a pure fluid amplifier having broad band frequency capabilities, generally designated 10, includes pure fluid transmitting means 12 and pure fluid receiving means 14. The transmitting means 12 includes a non-electronic modulator means 16 which is connected by a conduit 18 to a fluid-supply reservoir 20 adapted to supply a suitable fluid under pressure, such as compressed air, to the modulator means 16.

The modulator means 16 includes means to be hereinafter described for establishing a sound-sensitive, free jet discharging into an ambient fluid medium, such as air and for oscillating the jet. Prior to being oscillated, the jet may be modulated by an audio input delivered to the modulator means 16 through a hollow conduit 22 having a Y-shaped end 24 connected to the modulator means 16 and a free end 26 which carries a horn 28 for receiving the audio input from a suitable source, such as a person speaking into the horn 28. Upon being disturbed by the modulating signal (speech), the speech-modulated jet produces an elastic sound carrier wave in an ambient fluid medium which may be caused to leave the modulator means 16 through a suitable outlet 30 which directs the carrier to a suitable reflector, such as a parabolic reflector 32 which, in turn, may beam the carrier wave to a receiver some distance away or, alternatively, the carrier wave may be received by a horn 34 forming a part of the receiver means 14. The horn 34 is connected directly to the transmitting means 12 by an annular clamping ring 36. The ring 36 is provided with a plurality of spaced openings, such as the one shown at 38, through which the carrier wave from the reflector 32 is free to pass into a passageway 40, between the reflector 32 and the horn 34. The carrier wave travels through the passageway 40 and is received by a non-electronic demodulator means 42 which demodulates the carrier wave and transmits an audio output to a receiver 44 which is connected to the demodulator means 42 by a suitable conduit 46. It will, of course, be apparent to those skilled in the art that reflector 32 will be more effective when used to beam the carrier wave to another device having a horn like the horn 34 and a passageway like the passageway 40. It will also be apparent that, since horn 34 will function as a horn, compressional waves, set up adjacent openings 38 by the reflected carrier wave, will enter passageway 40.

The demodulator means 42 is connected to a fluid reservoir 48 by a conduit 50. The reservoir 48 supplies a suitable fluid under pressure, such as compressed air, to the demodulator means 42 for a purpose to be hereinafter described.

The device 10 is adapted for use in a mode similar to that of the well known "Walkie-Talkie" radio because of the portability thereof. A convenient way of supplying the compressed air to the modulator means 16 and the demodulator means 42 is to employ inflatable balloons for the reservoirs 20 and 48. It has been found that air from a toy balloon yields air at a sufficient pressure to allow speech communication between acoustic walkie-talkies or "sonic transceivers" spaced several hundred feet apart. Note that such a system affords speech privacy since the sound waves transmitted between transceivers is an amplitude modulated carrier which is totally unintelligible. In the event that the carrier wave selected is at a sufficiently high frequency to be inaudible to the human ear, then the speech or information communication system allows excellent speech privacy. As is illustrated, duplex operation is possible and the operator of the device receives a "sidetone." Thus, he is able to monitor his own transmission.

Figure 12:
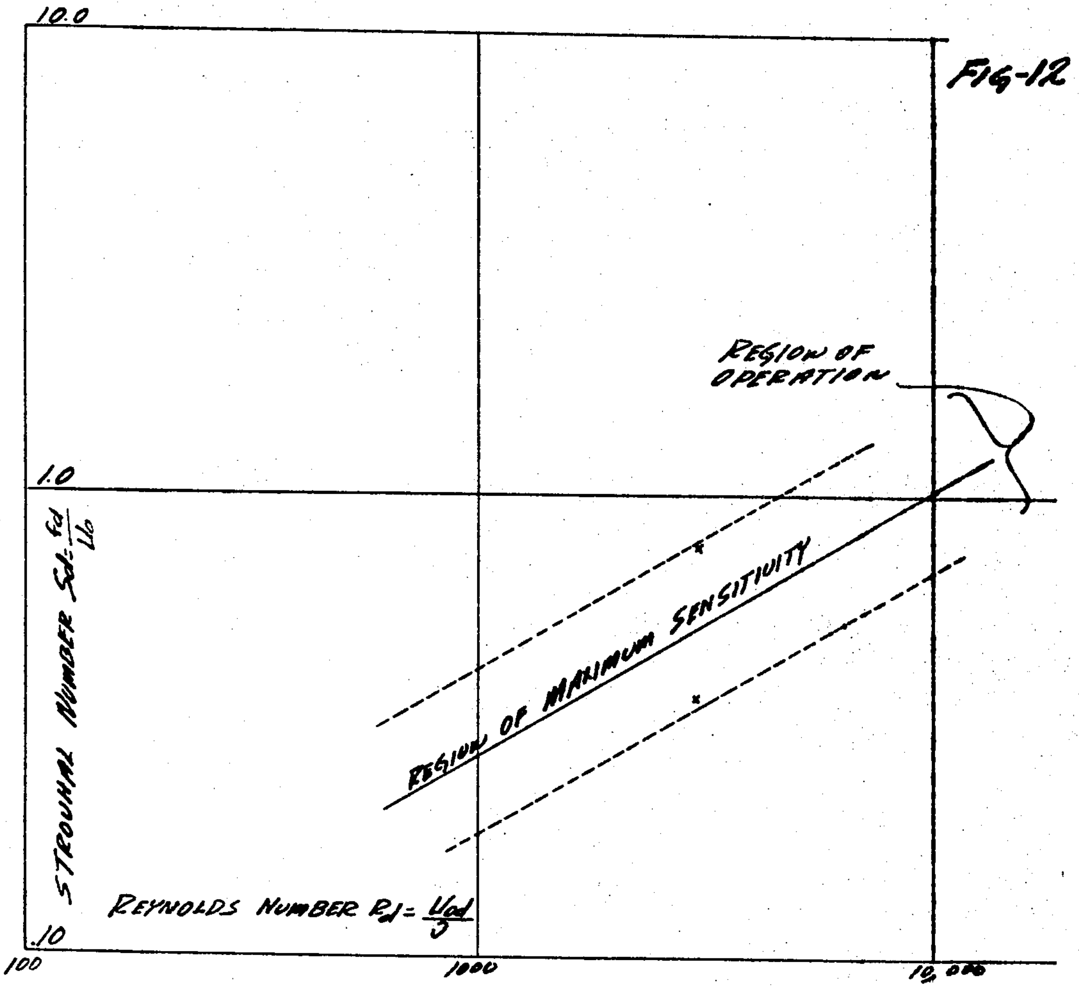
FIGURE 12 is a graphical representation of the region of operation for a sound-sensitive circular jet.

FIGURE 1 is merely an example of how the acoustic amplifier may be applied as a useful communication device. In this example the signal gain from input to the modulator to output of the demodulator is less than unity primarily because the carrier wave input to the demodulator horn is merely the stray field of the modulation reflector. When the modulator and demodulator are connected so that acoustic losses are minimized, as in FIGURE 41, the acoustic gain is much greater than unity. In practice, it has been found that acoustic power gains up to 10 are possible for a single stage, as illustrated in FIGURE 12.

A better understanding of the principles of operation of pure fluid amplifiers like the device 10 may be had by referring to FIGURES 2–10. Under appropriate operating conditions, fluid jets are sensitive to sound. Sound will disturb the normal flow pattern or streamlines of a fluid jet and it is this feature which is utilized by the present invention to obtain a pure fluid amplifier having broad band frequency capabilities for the pure fluid amplification of acoustic signals.

When a jet is in a "sensitive" state it has a limited bandwidth and, therefore, has a maximum sensitivity at some frequency which depends on the geometry of the jet and various associated flow parameters. The useful bandwidth of a sensitive jet is generally less than an octave. This is the reason conventional fluid amplifiers will probably never have a bandwidth sufficient to cover the audio spectrum. In order to increase bandwidths, negative feedback must be introduced to such an extent that no useful gain can be achieved. Obviously, amplification over an octave centered in the voice spectrum would not be very satisfactory for a communication system. For instance, telephone lines use about three and one-half octaves to cover the bandwidth of 300 c.p.s. to 3600 c.p.s. and, to preserve fidelity or voice character, 5 or 6 octaves are required, say from 200 c.p.s. to 6,400 c.p.s. or to 12,800 c.p.s.

Figure 2:
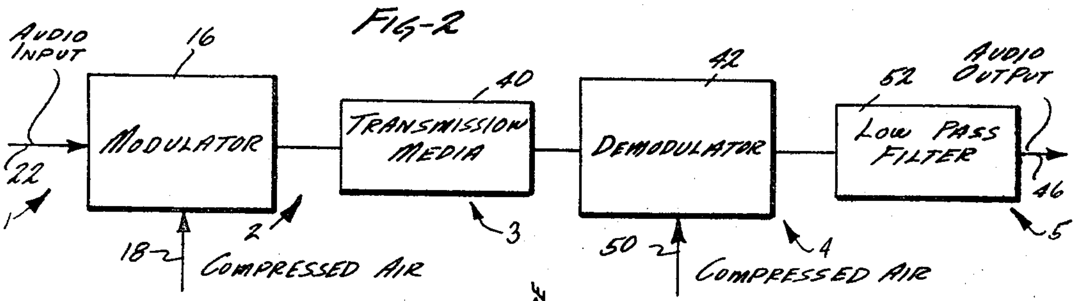
FIGURE 2 is a block diagram of a pure fluid acoustic amplifier.

The approach of the present invention is to operate a fluid jet system at frequencies above the audio band. For example, if the jets are sensitive at 20 kc. p.s., then an octave from 15,000 c.p.s. to 30,000 c.p.s. is covered which allows a 15 kc. p.s. bandwidth. The devices of the present invention utilize features successfully practiced in radio communication; however, non-electronic elements in the form of pure fluid components are employed. The block diagram shown in FIGURE 2 illustrates this approach. For the pure fluid system, the modulator means 16 and the demodulator means 42 are fluid jet devices and are referred to herein as "active devices" compared to the other components of the system which are "passive devices" requiring no external power source for their operation.

*The modulator means*

The fluid jet modulator means 16 produces an acoustic signal of essentially constant amplitude and frequency in the absence of an input acoustic (audio) signal. In the presence of an input acoustic signal, the output from modulator means 16 is modulated in amplitude. Of course the device 10 could also effect frequency modulation or perhaps both amplitude and frequency modulation depending upon its construction. In general, the device 10 and the other devices to be hereinafter described are considered as amplitude modulators although a small amount of frequency modulation always exists. Usual operation is of the double-sideband- plus-carrier type although in practice the sidebands are not necessarily of equal amplitude.

*The transmission media*

The transmission media can take various meanings and forms, such as the passageway 40 shown in FIGURE 1, but, in general, the purpose of the transmission media is merely a means for conducting a modulated carrier wave (an acoustic signal or air borne sound waves) from the modulator means 16 to the demodulator means 42.

The transmission media 40 may also take the form of a tube or waveguide as used for acoustic amplification applications where the modulator means 16 and the demodulator means 42 are relatively close together, say a few acoustic wave lengths. The transmission media 40 may be, in the broadest sense, means such as the parabolic reflector 32 and the horn 34 shown in FIGURE 1, for sending and receiving a sound beam.

*The demodulator means*

The jet demodulator means 42 plays a role equivalent to that of a transistor detector in radio communication where the transistor is operated in a condition of cutoff or saturation so that the input signal is amplified as well as rectified. For amplitude modulation detection, the jet demodulator means 42 may be operated without any acoustic resonant elements. Of course resonant elements may be incorporated to increase sensitivity at the expense of frequency bandwith. For frequency modulation detection, an acoustic resonant element is incorporated into the system so that slope detection is possible before rectification is performed, as will become apparent hereinafter. In the event that both frequency modulation and amplitude modulation are to be detected in one stage, operation is on the low frequency side of resonance so that the detected outputs are additive. As indicated with the transistor analogy, the jet demodulator means 42 has the advantage that it functions as an amplifier (referred to herein sometimes as a "hydrodynamic traveling wave amplifier") as well as a rectifier.

*The low pass filter*

The system shown in FIGURE 1 may be improved by incorporating low pass filter means 52 in the system. The low pass filter means 52 is not essential to the operation of the device 10 as an amplifier, but its inclusion is at times advantageous. In the event that the carrier wave from the output of the modulator means 16 is at an audible level, an acoustic low pass filter may be used to increase the signal-to-noise ratio. Prior art acoustic element filters of classical design which have shunting compliances have been used in a manner quite familiar to those skilled in the sound-suppression art.

*Mode of operation*

Figure 5:
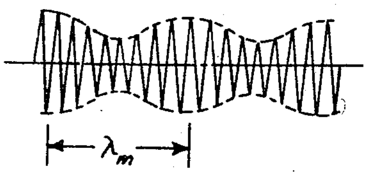
FIGURES 5 and 6 are diagrammatic representations of single-tone modulations of a carrier wave produced by the modulated section of the amplifier of FIGURE 2.
Figure 6:
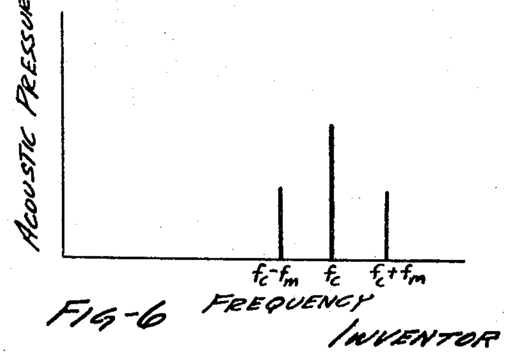
Figures 7, 8, 9, 10:
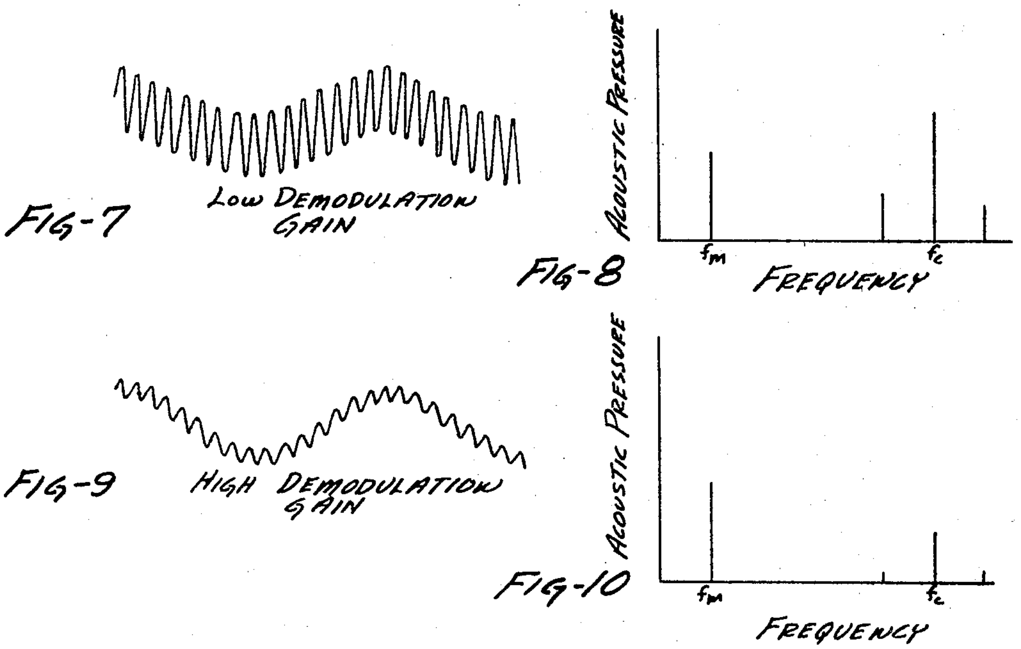
FIGURES 7–10 are diagrammatic representations of single-tone demodulation of the modulated carrier wave produced by the amplifier of FIGURE 2.

The character of the acoustic signal at five stations, identified by the numerals 1–5, inclusive, in FIGURE 2 will now be considered. For simplicity, and at no loss to the description of the most general form of operation of the device 10, an input signal comprising a pure tone of constant amplitude will be considered. Such a signal is shown diagrammatically in FIGURES 3 and 4. Station 2 represents the output of the modulator means 16. Unless otherwise indicated herein, the discussion relating to the operation of device 10 will be considered in connection with amplitude modulated signals as distinguished from frequency modulated signals. In the absence of an audio modulation signal, the output from the modulator means 16 is merely a pure tone which is called a "carrier". FIGURES 5 and 6 illustrate a carrier which has been modulated at approximately 50%. The frequency-amplitude spectrum of the amplitude modulated signal is shown in FIGURE 6. The spectrum of the amplitude modulated carrier of station 2 does not contain the audio or modulation frequency $f_m$. In practice, it is most likely that some audio feed-through will result. That is, the modulation signal will pass through the modulator means 16 and mix in a linear manner with the amplitude modulated signal. In general, the modulating signal will be attenuated when passing through the modulator means 16. Should the audio feed-through be detrimental, the transmission media 40 can be made to behave as a high-pass filter so that the modulating signal does not reach the demodulator means 42.

As will be hereinafter described in more detail, the presence of the modulating signal will have little influence on the operation of the jet demodulator means 42, but there may be other reasons for attenuating the modulating signal as it leaves the modulator means 16. For example, it may be desirable to have a sonic transceiver, such as a pair of devices 10, where the carrier is to be inaudible and at an ultrasonic frequency or where speech privacy is desired. In FIGURE 6, $f_c$ denotes the carrier frequency which is the frequency at which an oscillator (to be hereinafter described) in the modulator means 16 operates. In FIGURE 6, $f_c-f_m$ and $f_c+f_m$ are commonly denoted as lower and upper sidebands, respectively. The devices of the present invention utilize both lower and upper sidebands because the modulator means 16, and other modulators to be hereinafter described, characteristically have both. It is worth noting, though, that the demodulator means 42 will operate with either sideband missing. As will be more fully explained hereinafter in connection with the operating characteristics of the demodulator means 42, it may be advantageous to have single sideband operation. Fidelity and bandwidth can be favored by this mode of operation.

The signal at station 3 in FIGURE 2 will depend more the transfer function of the transmission media 40, but essentially it will be the same as the signal at station 2 although it may perhaps be somewhat attenuated. The output of the demodulator means 42 at station 4 will appear as shown in FIGURES 7–10. The signal is characteristic of linear mixing. The relative amplitudes depend on the manner or mode of operation of the demodulator means 42. If the device 10 is operated so that the spacial gain of a hydrodynamic traveling wave amplifier, to be hereinafter described, is large, the vortex coalescence is such as to product a neffectively larger gain at the modulating signal frequency, as is exemplified in FIGURES 9 and 10. This condition predominates particularly for large percentage modulated signals. The signal at station 4 may be suitable if the presence of the carrier signal does not cause masking. For applications where the carrier signal is at an audible frequency, the addition of the low pass filter 52 is advantageous. The signal at station 5 then presumably is a reproduction of the original modulating signal. Of course various forms of distortion may be encountered in actual practice, but under favorable operating conditions the signal reproduction is good.

*Description of the modulating means*

The jet modulator means 16 comprises basically (1) a hydrodynamic oscillator, sometimes referred to herein as as a "hydrodynamic traveling wave amplifier with positive feedback," and (2) means for disturbing the feedback or the influence of the feedback with an audio input or acoustic signal, referred to herein sometimes as a "modulating signal." Some of the devices to be hereinafter described also include an acoustic resonator associated with or coupled to the hydrodynamic cycle to enhance operation at a well defined frequency and to also augment the sound level output.

The modulator means 16 will be described hereinafter first in its simplest form and then various modifications will be presented which may be made to alter or improve the operational characteristics of the modulator means. Although the devices to be hereinafter described employ circular jets, it is to be understood that both the modulating means 16 and the demodulator means 42 may use plane jets.

*A hydrodynamic oscillator*

Figure 11:
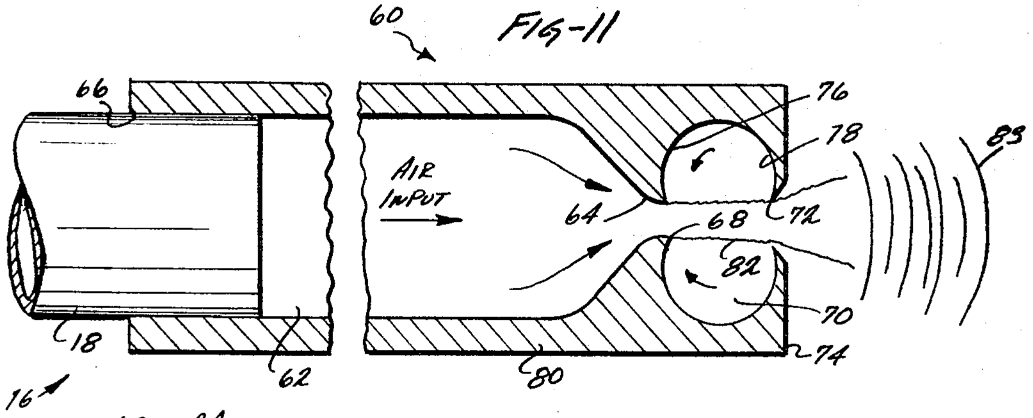
FIGURE 11 is a cross-sectional view, showing somewhat diagrammatically, the fundamental hydrodynamic oscillator used in the present invention.

The most elementary form of a hydrodynamic oscillator is shown at 60 in FIGURE 11. The oscillator 60 may be incorporated into the modulator means shown schematically at 16 in FIGURE 1 and includes conduit means 62 which is preferably a circular tube terminating in a contoured nozzle 64. The conduit means 62 includes an end 66 which is connected to the conduit 18 so that air under pressure from the reservoir 20 (FIGURE 1) may enter the conduit 62 and flow through the nozzle 64. The nozzle 64 terminates in a circular orifice 68 which is in fluid communication with a cavity 70. The cavity 70, in turn, communicates with a flow interrupter orifice 72 provided in the downstream end 74 of the oscillator 60. The cavity 70 includes an upstream portion 76 adjacent the orifice 68 and a downstream portion 78 adjacent the orifice 72.

The oscillator 60 also includes a cylindrical housing member 80 in which the conduit 62, the orifices 68 and 72 and cavity 70 are provided. The cavity 70 forms an annulus within the housing 80 and its downstream portion 78 constitutes a flow interrupter plate adjacent the flow interrupter orifice 72. The relative dimensions of the conduit means 62, the orifice 68, the cavity 70, and the flow interrupter orifice 72 may be chosen in a manner to be hereinafter described.

When air under pressure flows from reservoir 20 through conduit 18 into conduit 62 and through the contoured nozzle 64, flow separation exists at orifice 68 and a free jet 82 is formed which attempts to pass through the orifice 72 which has an aperture diameter slightly larger than that of the orifice 68. The flow which can not pass through the orifice 72 is deflected by the solid boundary of the flow interrupter plate 78. The resulting pressure disturbance on the plate 78 commences to propagate from its source. This instigates an increase in the flow through orifice 72 and a decrease in the flow through orifice 68 which can be considered as a disturbance on the stream velocity and hence the vorticity localized in the region of flow through orifice 68. This disturbance is conducted downstream at the hydrodynamic wave velocity $\alpha U_o$, where $\alpha$ is a function of the Strouhal number and $U_o$ is the average stream velocity at the orifice 68 ($\alpha$ ranges from 0.25 to 0.75). The Strouhal number $S=df/V_0$ where $d$=characteristic dimension (e.g. orifice 68 or channel 62 diameter)

$f$=frequency in $H_z$ $V_0$=average stream velocity at orifice 68

As the disturbance is convected downstream, the vorticity in the shear layer of the jet coalesces and the disturbance grows. The cycle repeats and if the amplification of the disturbance is sufficient and the phase correct, self-sustained oscillation results. This process yields fluctuations in the mass flow rate through orifice 72 and consequently the fluctuating flow constitutes a sound source or carrier wave 83 at the same frequency as that of the hydrodynamic flow within cavity 70. The conditions for self-sustained oscillation are somewhat intricate, but the dimensionless variables Reynolds number and Strouhal number play a dominate role. FIGURE 12 shows the region in the R–S plot where operation is possible. As might be expected, this region of operation coincides with the region where the circular jet 82 is most sensitive to small disturbances.

*The basic modulator*

Figure 13:
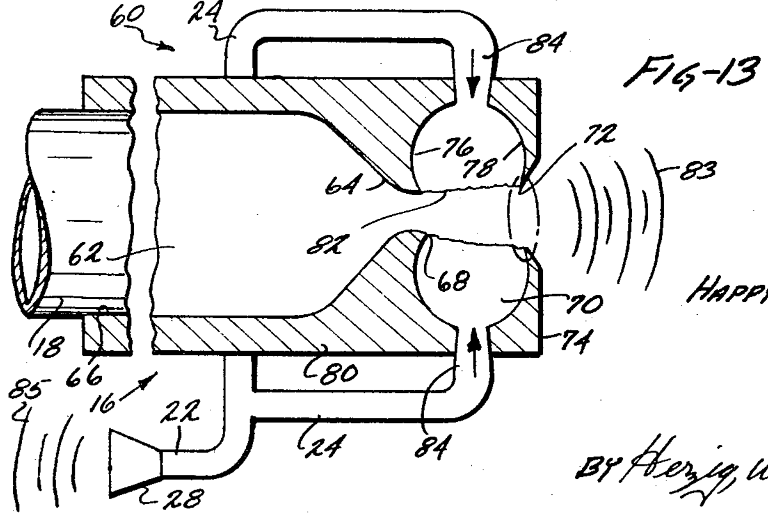
FIGURE 13 is a view similar to FIGURE 11 showing the addition of waveguide means to the hydrodynamic oscillator of FIGURE 11 to form a basic modulator of the pressure-disturbance type of the present invention.

The modulator means 16 shown diagrammatically in FIGURE 1 may take the form shown in FIGURE 13 wherein waveguide means, such as a pair of waveguides 84, may be added to the oscillator 60. The waveguides 84 are connected to the audio input horn 28 by the conduit 22 through its Y-shaped end 24. A modulating signal comprising the audio input 85 to the device 10 may then be introduced into the cavity 70 through the horn 28 and waveguides 84 causing pressure variations in the cavity 70 which tend to partially cancel or augment the hydrodynamic pressure feedback and hence the stream 82 is modulated together with the carrier wave 83 of the oscillator 60. The cavity 70 behaves as a shunting compliance to the audio input or input modulation signal so that the volume of the cavity 70 should be small in order to achieve high frequency modulation. Applying the audio input in this fashion yields a symmetrical or axially symmetric stream disturbance. This form of drive is termed a "pressure-disturbance" drive. While generally satisfactory, this form of drive will not produce as high a frequency response as that which may be obtained with a "velocity-disturbance" type drive to be hereinafter described.

In practice, it has been found that the hydrodynamic flow is sufficiently hindered to suppress oscillation when the cavity 70 becomes quite small so that it is apparent that the condition for good oscillation and simultaneous sensitive modulation characteristics are incompatible.

Figures 14, 17, 18, 19:
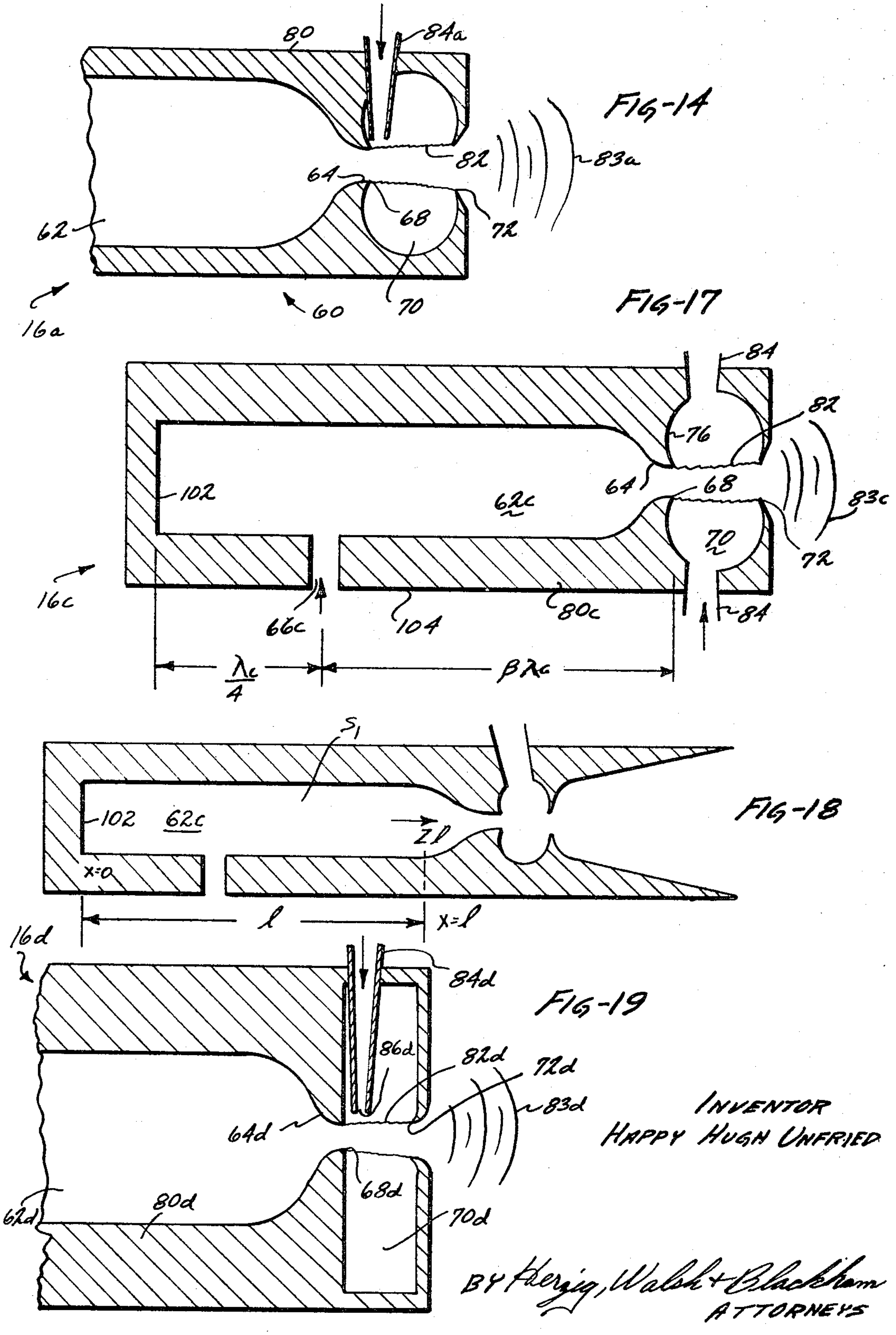
FIGURE 14 is a view similar to FIGURE 11 showing the addition of a waveguide to the hydrodynamic oscillator of FIGURE 11 of the velocity-disturbance type of the present invention.
FIGURE 17 is a view similar to FIGURE 13 showing a pressure-disturbance type modulator of the present invention having a longitudinal acoustic resonator incorporated therewith.
FIGURE 18 is a diagrammatic representation of a longitudinal resonator coupled to a hydrodynamic oscillator of the present invention, with the inclusion of a horn.
FIGURE 19 is a view similar to FIGURE 14 showing a velocity-disturbance type modulator with a radial mode acoustic resonator of the present invention.

The velocity-disturbance type drive is shown in FIGURE 14 wherein a modulator means **16*a* includes an oscillator 60 having a cylindrical housing 80, conduit 62, nozzle 64, orifice 68, cavity 70 and orifice 72 identical to those shown in FIGURES 11 and 13. However, the waveguides 84 shown in FIGURE 13 are replaced with a modified waveguide 84*a* which extends well into the cavity 70 and quite close to the orifice 68 as compared with the waveguides 84 which terminate at the boundary of the cavity 70 somewhat downstream of the orifice 68**.

When a modulating signal in the form of an audio input or the like is introduced into the cavity 70 through the waveguide **84*a* a transverse velocity-disturbance is applied to the stream 82 which also produces modulation resulting in the amplitude modulated carrier wave indicated diagrammatically at 83*a***.

As will be more fully discussed hereinafter, such a disturbance initially produces an asymmetric hydrodynamic motion which generally transforms, within a few convected wave-lengths, into a symmetrical flow pattern. While generally satisfactory and superior to the aforementioned pressure-disturbance type drive, this velocity-disturbance type drive has the disadvantage that the presence of the waveguide **84*a* tends to hinder the hydrodynamic feedback as well as the quasi-steady axially symmetric secondary flow in the cavity 70**.

*Symmetrical and asymmetrical flow disturbances*

Figure 15:
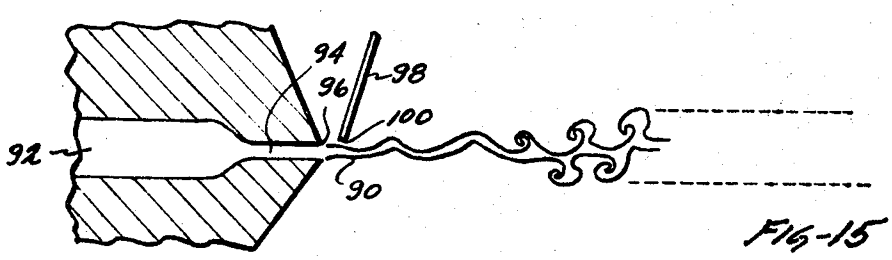
FIGURE 15 is a diagrammatic representation of a velocity-disturbance of a plane jet with resulting symmetrical flow.
Figure 16:
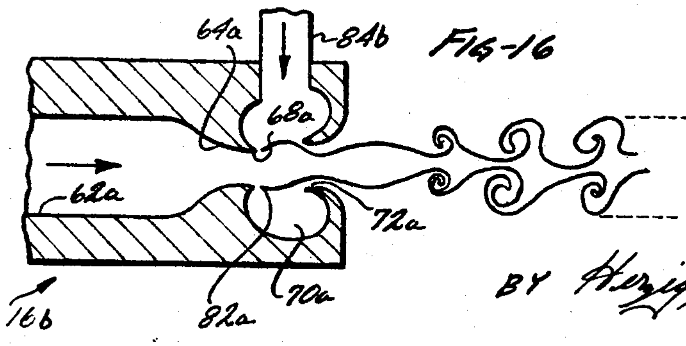
FIGURE 16 is a diagrammatic representation of a pressure-disturbance of a circular jet with resulting symmetrical flow.

The differences between the pressure-disturbance type drive and the velocity-disturbance type drive will be readily understood by referring to FIGURES 15 and 16. A velocity-disturbance may be further qualified as a transverse velocity disturbance which initiates in the sheer layer of the jet a disturbance which is asymmetric with respect to the jet axis. In FIGURE 15 a plane jet 90 is established in known manner by passing a suitable fluid through a conduit 92, a rectangular channel 94 and a rectangular nozzle exit 96. An acoustic disturbance may be applied to the jet 90 through a horn 98 having a discharge end 100 which is positioned closely adjacent the jet 90, but not sufficiently close to disturb the flow of the jet 90 in the absence of an acoustic or audio input signal through the horn 98. The horn 98 is tapered and is used as an acoustic particle velocity transformer with the ratio of acoustic velocity being generally inversely proportional to the area ratio of the horn 98. The vector sum of the acoustic particle velocity and the jet velocity form the initial disturbance of the free jet 90. Alternatively, the driving function can be considered the pressure gradient established by the propagation of the acoustic input wave. This disturbance, which can be considered as a perturbation in the vorticity of the jet will become amplified as it is convected downstream if the jet 90 is sensitive to the frequency of the applied disturbance or audio input. FIGURE 15, of course, depicts a case where the jet 90 is sound sensitive.

It should now be considered whether or not it is possible to have a symmetrical vortex pattern. Theoretically, two parallel vortex rows, known as the Karman Vortex Street, are stable only when the vortices are alternately spaced. The prior literature reports symmetrical disturbances in plane jets near the nozzle which are transformed within a few flow wavelengths to asymmetrically spaced vortices. Hence, it appears that it is not a natural or stable state of flow when the vortex pattern in a plane jet is symmetric. In practice, if a symmetrical disturbance could be applied to a plane jet, it would be expected that the resulting flow would ultimately become asymmetrical.

Referring now to FIGURE 16, pressure-disturbance type drives may be considered by employing a modulator having a geometry similar to that shown at **16*b* wherein a circular conduit 62*a* includes a contoured nozzle 64*a* and orifice 68*a* communicating with a cavity 70*a* which, in turn, communicates with a flow interrupter orifice 72*a*. A circular, free jet 82*a* issues from the orifice 68*a* into the cavity 70*a*. A waveguide 84*b* communicates with the cavity 70*a* for introducing an audio input thereto. The acoustic pressure developed in the cavity 70*a* impresses perturbations on the flow through the orifices 68*a* and 72*a*. Hence, the cavity pressure variations modulate the longitudinal stream velocity (axial pressure gradient) and the resulting flow is symmetrical with the development of ring vortices. Here again, it should be considered whether or not it is possible to have an asymmetrical vortex pattern. This means that the vortex filaments which end on themselves would be skewed with respect to the jet axis. Here again there appears to be a preferred pattern and experimentally the symmetrical flow appears to develop irrespective of the input signal through the waveguide 84*b***.

In a demodulator means to be hereinafter described, a velocity-disturbance may be applied to a circular jet. If the developed flow pattern were asymmetrical, demodulation would still result, but the generated carrier and its sidebands would be at twice the applied frequency. However, it has been found that no frequency doubling results so that it appears that the developed flow is symmetrical even though the applied disturbance initiates an asymmetrical disturbance in the jet.

Considering the modulator means, on the other hand, fewer developed flow wavelengths are available compared to the demodulator means. Experiments with both velocity-disturbance drive and pressure-disturbance drive indicate that there is essentially no difference in the output of the signal or in the sensitivity of the device. Experience with both approaches has shown that the modulator construction is perhaps simpler, although biasing is more difficult, with the pressure-disturbance and the demodulator construction is simpler with the velocity-disturbance although both modes work for the two units.

*Addition of an acoustic resonator*

The acoustic efficiency of the oscillator 60 may be increased, as will be discussed in connection with FIGURES 17, 18 and 19, by including an acoustic resonator in the system. A resonator also tends to stabilize the carrier frequency. Although various types of resonators will manifest themselves, two types will be described herein for purposes of illustration, but not of limitation. Referring now to FIGURE 17, a modulator 16c includes a cylindrical housing 80c which is provided with a resonant chamber or cavity 62c having a rigid termination in the form of a wall 102. A fluid inlet 66c is provided in the encompassing sidewall portion 104 of the housing 80c for admitting a suitable fluid under pressure into the chamber 62c. For example, the inlet 66c may be connected to the reservoir 20 shown in FIGURE 1 by the conduit 18 shown therein. The modulator 16c also includes a nozzle 64, orifices 68 and 72, cavity 70 and waveguides 84, all of which may be identical to the corresponding elements shown in FIGURE 13.

The resonant chamber 62c permits longitudinal waves of the appropriate frequency (to be discussed more fully hereinafter) to form a resonant condition.

The rigid termination 102 is one-quarter of an acoustic wavelength from the inlet 66c. This permits the fluid to enter at a low impedance point in the acoustic standing-wave pattern so that the presence of the inlet 66c has a minimum effect on reasonance. The distance from the inlet 66c to the orifice 68 is $\beta\lambda$ where $1/4<\beta<1/2$ and $\lambda$ is the acoustic wave length. The value of the appropriate $\beta$ depends on the impedance looking into the orifice 68 from the upstream side thereof. A modulating signal in the form of an audio input into the waveguides 84 modulates the jet 82 in the same manner as that discussed in connection with FIGURE 13 and the output from the modulator 16c comprises an amplitude modulated carrier wave 83c. Although the modulator 16c has been shown in FIGURE 17 and described herein as employing a modulating signal operating as a pressure-disturbance, it will be apparent to those skilled in the art that the velocity-disturbance mode of operation is also possible.

where $X$=distance along channel 62c downstream of wall 102c
$l$=length of channel 62c
$P$=density of fluid radium
$C$=velocity
$S_1$=cross-sectional area of channel 62c
$A_1$ and $B_1$=amplitude constants
$e$=base of natural logarithm
$j=\sqrt{-1}$
$k$=wave number=$2\pi/\lambda$ where $\lambda$ is true wave length With the boundary conditions $Z_{(0)}=\infty$ and $Z(l)=Z_1$ the eigenvalue equation is to be $$\cot=\frac{2\pi l}{\lambda}=-J\frac{S_1Z_l}{PC}$$

where the second resonant mode may be sought. When $Z_l$ cannot be estimated, it can be measured by standard acoustic impedance methods.

Referring now to FIGURE 18, a longitudinal reasonator may be tuned as follows:

The impedance at any location in the channel 62($c$) may be described as $$\overline{Z}_{(x)}=\frac{PC}{S_1}\left[\frac{A_1e^{-jKX}+B_1e^{jKX}}{A_1e^{-jKX}-B_1e^{jKX}}\right]$$

Another type of resonator is shown in FIGURE 19 wherein a modulator 16d includes a cylindrical housing 80d in which a cylindrical conduit 62d, a nozzle 64d, and orifices 68d and 72d are provided. A fluid under pressure, such as compressed air, from a suitable source, such as the reservoir 20 showing in FIGURE 1, may be introduced into the conduit 62d to establish a free jet 82d which is oscillated in the manner described in connection with FIGURE 11. The oscillating jet may be modulated by an audio input signal which may be introduced through a waveguide 84d. The waveguide 84d includes an outlet 86d which is positioned closely adjacent the orifice 68d so that operation is of the velocity-disturbance type.

The modulator 16d also includes a radial mode resonator 70d comprising a cylindrical chamber having a radius selected so that the first radial acoustic mode corresponds to the carrier frequency of the amplitude modulated carrier wave 83d. The volume of the resonator 70d is sufficiently large that the velocity-disturbance type drive is desirable because the pressure-disturbance type drive is less effective for such large volumes.

*Horn coupling*

Figures 20, 21, 22, 23:
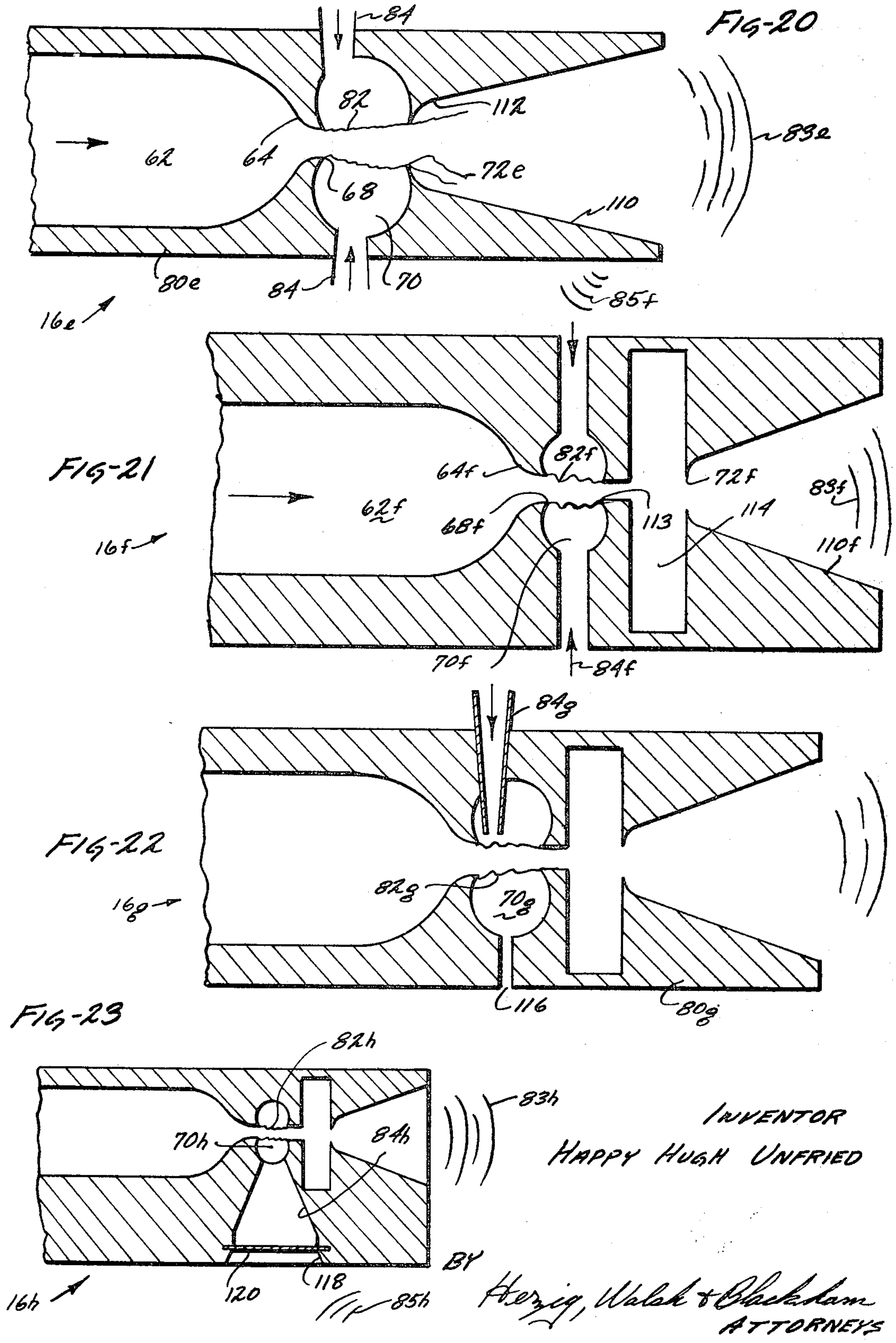
FIGURE 20 is a view similar to FIGURE 13 showing the addition of a horn to the device of FIGURE 13 to increase acoustic radiation.
FIGURE 21 is a view similar to FIGURE 20 showing a two stage modulator of the pressure-disturbance type having a radial mode acoustic resonator and horn coupling.
FIGURE 22 is a view similar to FIGURE 21 showing a two stage velocity-disturbance type modulator having a radial mode acoustic resonator, bias leak, and a horn coupling.
FIGURE 23 is a horizontal cross-sectional view showing somewhat diagrammatically a two stage pressure-disturbance type modulator having a radial mode acoustic resonator, a diaphragm biasing device and a horn coupling.

In FIGURE 20 a modulator 16e may be identical to the modulator 16 shown in FIGURE 13 except that a coupling device in the form of a horn 110 is included in the cylindrical housing 80e downstream of an orifice 72e. The modulator 16e includes the usual cylindrical conduit 62, nozzle 64, orifice 68, free jet 82, cavity 70 and waveguides 84. The horn 110 increases the radiation resistance presented to the modulated carrier wave 83e. The horn 110 includes a throat 112 which is several times larger in area than the flow interrupter orifice 72e. This is done primarily to keep the low frequency impedance of the horn throat 112 at a minimum and also allow free expansion of the hydrodynamic flow from the orifice 72e. It has been found in practice that a horn throat 112 the size of the orifice 72e tends to choke the flow and attenuate, if not entirely subdue, the oscillations.

*Two stage modulator*

FIGURE 21 shows a two stage modulator 16f wherein a fluid under pressure, such as compressed air from a reservoir, such as the reservoir 20 shown in FIGURE 1, is introduced into a circular conduit 62f which communicates with a nozzle 64f having an orifice 68f establishing a free jet 82f within a cavity 70f. The flow from the orifice 68f enters the cavity 70f and then passes through a second orifice 113. A modulating signal in the form of an audio input 85f is admitted to the cavity 70f through waveguides 84f and acts on the stream 82f between orifice 68f and cavity 70f in the pressure-disturbance mode fashion. From the orifice 113, the flow enters a radial-mode resonator or oscillator cavity 114 before exhausting through a third orifice 72f and into a coupling horn 110f. The output of the horn 110f is in the form of an amplitude modulated carrier wave 83f. The modulator 16f permits designing the oscillator cavity 114 with a relatively large size and free from flow disturbances due to the presence of the waveguides. Also, the fluid jet 82f disturbed by modulating signal 85f has many hydrodynamic wave lengths to propagate before encountering the oscillator region in cavity 114 so that an appreciable spacial gain of the modulating signal can be obtained. The spacial gain can be increased by operating at a lower Strouhal number in the oscillator region 114 than a hydrodynamic oscillator, such as that shown in FIGURE 11, will function without a resonator.

The distance between the orifices 68f and 113 must be less than that which would allow free oscillation at the operating R–S point. Orifice 113 is always smaller than orifice 68f to further insure the absence of carrier frequency oscillation. Decreasing orifice size in this manner accelerates the flow thereby stabilizing the flow to disturbances in the frequency range coinciding with the R–S region of maximum instability. Such a contrivance tends to reduce the amplitude of the higher frequencies of the impressed modulating signal, but with the carrier frequency sufficiently far above the modulating frequency this attenuation is not significant.

FIGURE 22 illustrates a two-stage modulator 16g which is identical to the two-stage modulator 16f except that the waveguides 84f are replaced with a waveguide 84g so that the modulator 16g employs a velocity-disturbance mode. In addition, a bias leak 116 is placed in the housing 80g in communication with the cavity 70g to minimize displacement of the axis of the stream 82g by the influx of fluid through the waveguide 84$g$. That is, it is for static balancing of the stream.

FIGURE 23 shows a modulator 16$h$ which is identical to the modulator 16$f$ shown in FIGURE 21 except that the waveguides 84$f$ are replaced with a passageway 84$h$ which communicates with the cavity 70$h$. The passageway 84$h$ has an entrance portion 118 in which a diaphragm 120 is mounted. The diaphragm 120 forms a blocking compliance sealing the cavity 70$h$. An audio input signal 85$h$ vibrates the diaphragm 120 causing a pressure disturbance in the passageway 84$h$ which modulates the free jet 82$h$ oscillating within cavity 70$h$. This produces an amplitude modulated carrier wave 83$h$. The diaphragm 120 adds an additional constraint on the frequency response of the modulator 16$h$; however, in some cases the coupling of components to a modulator allows uncontrollable aspiration in its cavity. Such aspiration is minimized by a diaphragm, such as the diaphragm 120. When staging amplifiers, this approach is very useful although the amplifier response then is generally limited by the frequency pass band of the diaphragm.

*Theory of jet demodulation*

Figure 38:
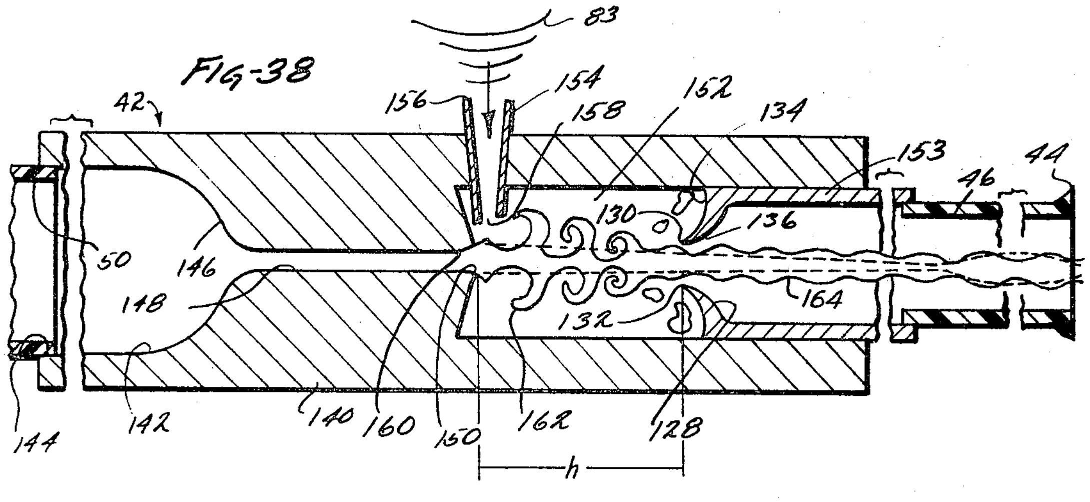
FIGURE 38 is a horizontal cross-sectional view, showing somewhat diagrammatically, a basic demodulator of the velocity-disturbance type which may be used in a communication system or amplifier of the present invention.

The jet demodulator shown schematically at 42 in FIGURE 1 is basically a device for producing a sound-sensitive fluid jet discharging into an ambient fluid medium, such as air and includes means for restricting the developed flow. The fluid jet is adjusted so that the Reynolds number and Strouhal number are such that the jet is unstable to acoustic disturbances at the carrier frequency. Then the induced stream disturbance is allowed to develop into its natural vortex flow pattern using the inherent hydrodynamic traveling wave amplification characteristics of the jet. Next the developed vortex flow is clipped. Clipping of the vortex flow is shown in FIGURE 38 wherein vortices 162 are chopped off by an orifice 130 in a flow divider plate 128 leaving a demodulated output signal 164 constituting a change in the mass flow rate which is proportional to the amplitude of the induced stream disturbance (modulated carrier wave 93). This produces the desired results of sound amplification and demodulation and propagation of the modulation of the frequencies as elastic sonic waves in an ambient fluid medium.

Figure 24:
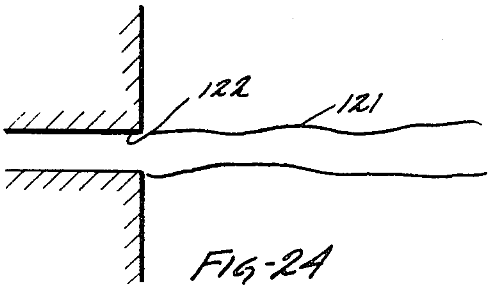
FIGURES 24 and 25 are diagrammatic outlines of a free circular jet in an undisturbed laminar state and in a state where it is disturbed by a periodic signal, such as a carrier frequency, respectively.
Figure 25:
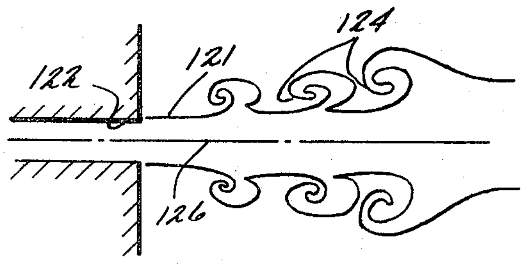
Figures 28, 31, 34:
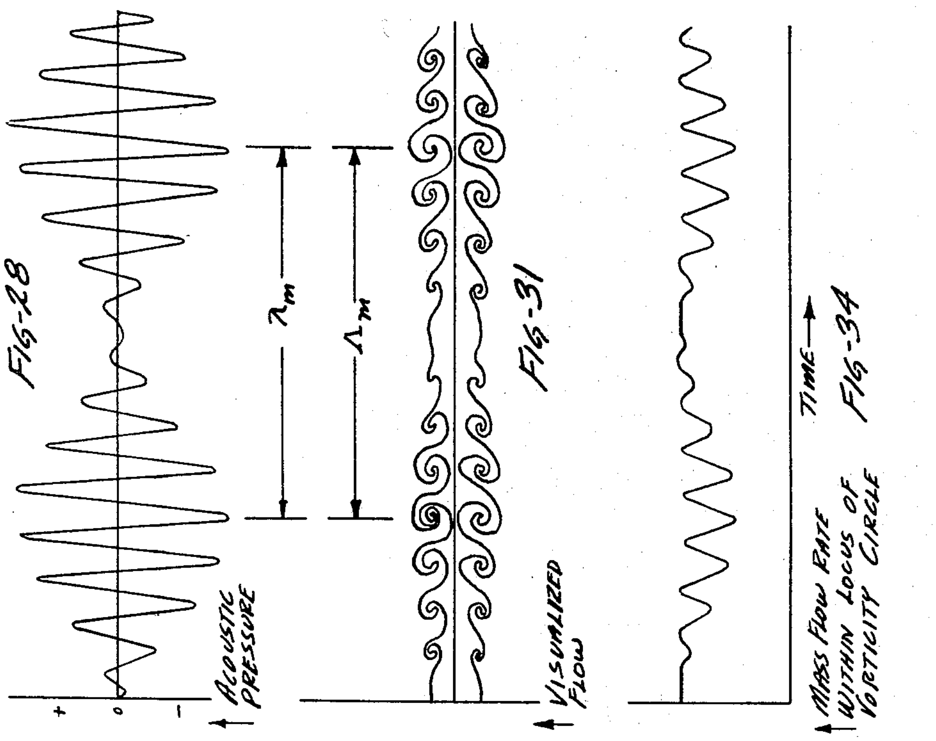
FIGURES 26–28 are diagrammatic representations of an applied acoustic disturbance wherein there is no acoustic signal, an acoustic carrier only, and an acoustic amplitude-modulated wave, respectively.
FIGURES 29–31 are diagrammatic representations of the resulting flow at a predetermined location downstream of a nozzle producing the conditions represented diagrammatically in FIGURES 26–28.
FIGURES 32–34 are diagrammatic representations of the resulting mass flow rate through a circle defined by a locus of vorticity for the conditions represented diagrammatically in FIGURES 29–31.
Figures 27, 30, 33:
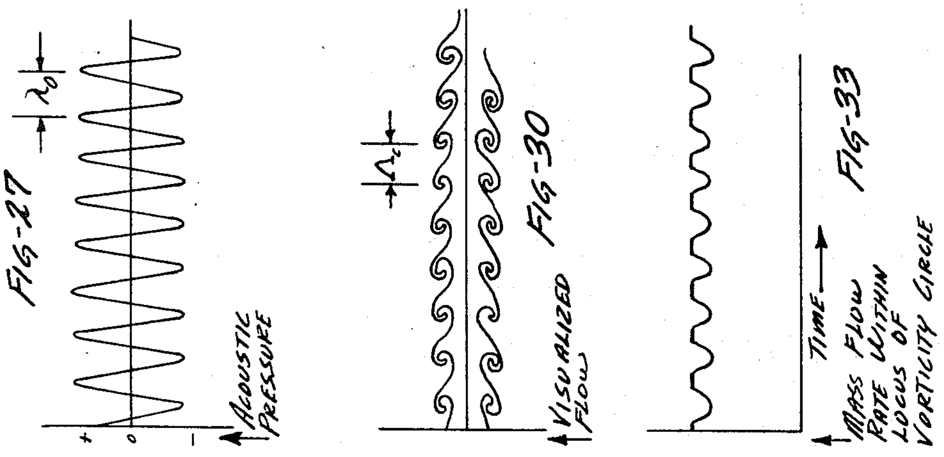

In FIGURE 24, a free jet 121 is illustrated schematically as issuing from a nozzle 122. The outline of the jet 121 is shown in its undisturbed, laminar state. In FIGURE 25, the jet 121 is illustrated schematically as being disturbed by periodic signals, such as the carrier frequency. The jet 121 is circular and the disturbances, indicated at 124, are symmetrical with respect to the axis 126 of the jet 121. Furthermore, the developed flow saturates in vortex rings. Referring now to FIGURES 26–37, if the flow is considered as seen by an observer located at some location $x=h$ downstream from the nozzle 122 (FIGURE 36) and assuming that the flow is not saturated at $h$—i.e., the vortices have not reached their maximum size, then FIGURES 27 and 28 will illustrate the applied disturbance at $x=0$ without and with a single tone modulation, respectively. In FIGURES 30 and 31, the flow is illustrated as seen by an observer at $x=h$ (FIGURE 36) when the jet is subjected to the respective disturbances. The center of the vortices at $x=h$ lie on a circle with a radius $r$ (FIGURE 36) which is independent of the size of the vortex. That is, the locus of vorticity at $x=h$ is independent of the magnitude of the applied disturbance. Since the mass flow rate of the developed vortex flow is, to a first order approximation, constant, the free jet generates no sound.

Figures 26, 29, 32:
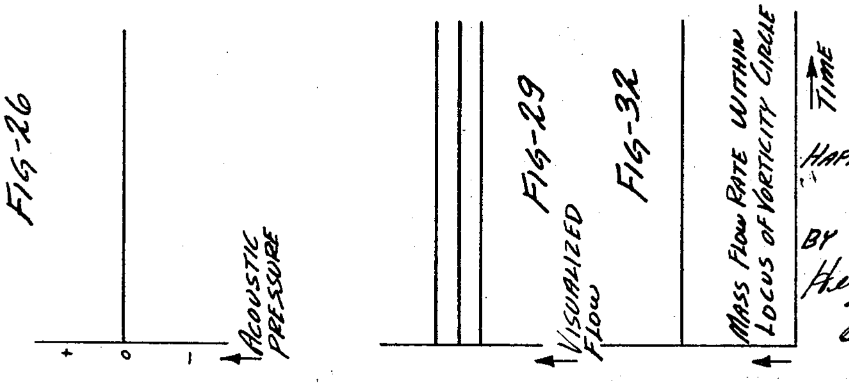

If the flow confined within the circle having the radius $r$ and defined by the locus of vorticity could be separated from the flow outside the circle, the mass flow rate would be time dependent and is illustrated in FIGURES 32–34. Of major importance is FIGURE 34 where it is immediflow rate within the circle contains a large component at the modulation frequency. It also contains the carrier frequency and its sidebands as well as harmonics thereof. Since the carrier frequently is assumed to be well above the modulation frequency, the harmonic distortion is of no consequence. Interestingly enough, there is no harmonic distortion of the modulation signal if vortex saturation is not reached. Of course, if the applied disturbance is sufficiently large or if the applied signal is over modulated, then harmonic distortion may become significant.

Referring now more in particular to FIGURES 35–37, the velocity profile and vorticity profile at some distance $x=h$ downstream of a nozzle is illustrated in FIGURE 35. When the laminar stream is disturbed, the resulting vortex coalescence is such that the developed ring vortices are filaments whose centers correspond to the point of maximum vorticity. This point may be ascertained as follows:

Taking the velocity profile as $$u_{(x,r)}=\frac{V}{x}\,\frac{2\sigma^2}{\left(1+\frac{\xi^2}{4}\right)^2}$$

where $u_{(x,r)}$=velocity profile at a point a distance $x$ downstream of nozzle 122 (FIGURE 36) and a radius $r$ from the center line of jet 121 to the filaments of the ring vortices $V$=kinematic viscosity of jet 121=viscosity/density $x$=distance downstream of nozzle 122

$$\sigma^2=\tfrac{3}{16}\,\frac{\mathring{M}}{\pi P V^2}$$

$$\xi^2=\tfrac{3}{16}\,\frac{\mathring{M}}{\pi P V^2}\,\frac{r^2}{x^2}$$

$\mathring{M}$=momentum flux rate taken as $\tfrac{1}{3}P\pi a^2 u_0^2$ $a$=radius of jet 121 at $x=0=d/2$ $d$=diameter of jet 121 at $x=0$ $P$=density of jet 121=mass/unit volume $u_0$=average stream velocity Then add a suitable correction to match volume flow rate at nozzle 122

$$x_0=\frac{R_d}{16}a$$

where $x_0$=zero distance from nozzle 122

$R_d$=Reynolds number of jet 121 at nozzle 122=$u_0 d/V$

Differentiation twice over yields $$\left(\frac{r}{a}\right)=1+\frac{32}{R_d}\left(\frac{h}{d}\right)$$

where $h=x+x_0$

To accomplish demodulation, a flow divider 128 may be placed a distance $h$ downstream of the nozzle 122 to intercept the stream 121. The flow divider 128 includes an orifice 130 having a sharp edge 132. The flow divider also includes an upstream side 134 and a downstream side 136. When the upstream side 134 is isolated from the downstream side 136, with the exception of the orifice 130, the mass flow fluctuations through the orifice 130 produce sound with the spectrum previously described.

As indicated in FIGURE 36, orifice 130 defines a circle having the radius $r$ previously referred to. Thus, flow divider 128 confines the flow from stream 121 within a circle defined by the previously mentioned locus of vorticity and separates this flow from the flow outside the circle by clipping or chopping off the vortices 162 shown in FIGURE 38.

The sound source is effectively dipole in nature, but with the infinite baffle in the form of the flow divider 128 it appears as a monopole from either side. Hence, the demodulated sound signal exists on either side of the flow divider 128 although the two effective sources are 180 degrees out of phase.

The demodulation phenomenon heretofore described does not take into consideration the idea that the free jet flow is influenced by the presence of the flow divider 128. If the surface of the flow divider 128 was contoured to that of the jet "streamlines," then its presence would not alter the flow. On the other hand, the streamlines are a function of the disturbance amplitude so that, in general, this criterion can not be met. It has been found experimentally, however, that a sharply contoured flow divider works satisfactorily.

*Basic demodulator*

The demodulator means 42 shown schematically in FIGURE 1 is illustrated in FIGURE 38 as having a cylindrical housing 140 in which a cylindrical input conduit 142 is provided. The conduit 142 has an inlet portion 144 which is connected to the reservoir 48 (FIGURE 1) by the conduit 50. Fluid under pressure, such as compressed air, flows from the reservoir 48 through the conduit 50 into the cylindrical input conduit 142 where the flow velocity is relatively small. The fluid leaves the conduit 142 through a nozzle exit 146 and enters a small circular channel 148 which has a length preferably greater than 20 times its diameter. The long channel 148 helps insure laminar flow at the channel exit 150. This laminar flow enters a cylindrical vortex chamber 152 from whence it passes through the previously described orifice 130 in the flow divider plate 128. The distance from the channel exit 150 to the leading edge 132 of the flow divider plate 128 is designated as $h$ which is 5Λ to 20Λ where Λ is the flow wavelength at the carrier frequency. The flow divider plate 128 is carried by a cylindrical member 153 which is reciprocally mounted in the chamber 152 so that the parameter $h$ is adjustable to vary the gain of the demodulator means 42 depending on the level of the amplitude-modulated carrier wave 83 transmitted by the modulator means 16 shown in FIGURES 13, 14, 17, 19, 20, 21, 22 or 23. The amplitude-modulated carrier wave 83 enters the chamber 152 through a waveguide 154 which is a frustum of a conical form having an enlarged end 156 and a small end 158. The end 158 is positioned closely adjacent the boundary of the jet 160 issuing from the channel exit 150, but is not close enough the disturb the flow in the absence of an acoustic input signal through the waveguide 154.

The flow divider plate 128 is a relatively thin orifice plate having a sharp but contoured leading edge 132. The diameter of the orifice 130 is selected once the operating Reynolds number and the relative spacial demodulator gain are known. The principle employed is that the developed vortex pattern has the center of the vortex filaments located on the locus of vorticity for the undisturbed laminar jet. The diameter of the flow divider plate orifice 130 is then selected to coincide with the calculated locus of vorticity.

With the jet 160 operating in such a manner that it is unstable to the amplitude-modulated carrier wave 83, then vortices 162 form which are proportional in size to the input signal at any one point $h$ and are chopped off by the orifice 130. The demodulated output signal 164 then constitutes a change in the mass flow rate which is proportional to the amplitude of the audio input 85 (FIGURE 13). Thus, a demodulated sound wave plus air passes through the conduit 46 and an amplified sound corresponding to the audio input 85 is heard at the horn 44 or any other convenient acoustic termination.

Figure 39:
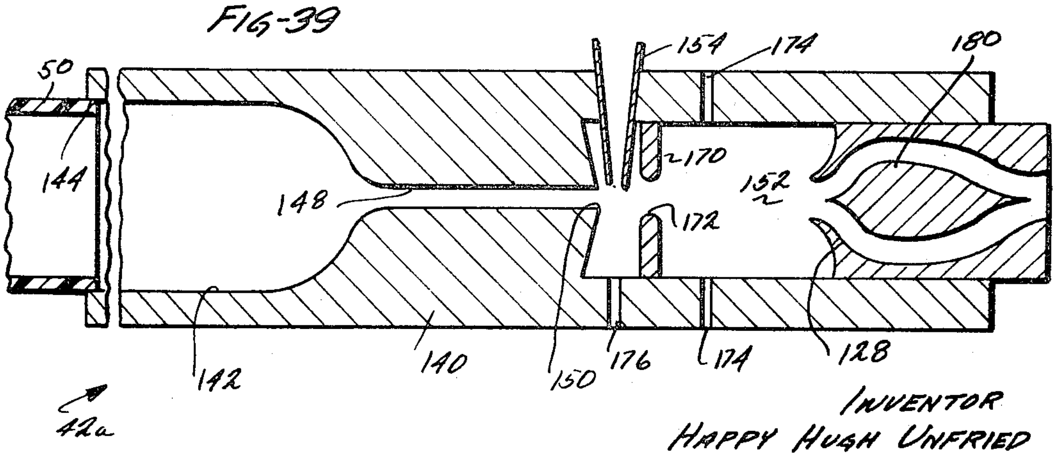
FIGURE 39 is a view of the device of FIGURE 38 having additional features incorporated therein.

A modified demodulator means 42a is shown in FIGURE 39 as being identical to the demodulator means 42 shown in FIGURE 38 except that a number of features have been added to the basic demodulator means 42 for improved performance. For example, a circular plate 170 having an orifice 172 provided therein is positioned in the chamber 154 immediately downstream of the waveguide 152 to serve as an anti-feedback plate which prevents the flow from oscillating. This keeps the sound which is created by the flow around the flow divider plate 128 from disturbing the jet 160 at the channel exit 150 where the jet is most sensitive to sound disturbances. The thickness of the plate 170 is on the order of one-half the diameter of the orifice 172. The diameter of the orifice 172, on the other hand, is slightly larger than the diameter of the channel 148. The anti-feedback plate 170 is preferably spaced from 2 to 4 channel diameters from the channel exit 150. Another feature included in the demodulator means 42a which is not present in the basic demodulator means 42 comprises a plurality of exhaust passages 174 which may be symmetrically spaced around the outer periphery of the housing 140.

The demodulator means 42a also includes a bias passage 176 which is placed in the housing 140 in communication with the chamber 152 upstream of the anti-feedback plate 170. The bias passage 176 counteracts pressure gradients established in the chamber 152 between the channel exit 150 and the anti-feedback plate 170 due to aspiration through the waveguide 154.

A bullet shaped object 180 is positioned in the demodulator means 42a downstream of the orifice plate 128 for the purpose of reducing the velocity of the flow downstream of the plate 128 in a quick expansion process which lowers flow noise generation.

Figure 40:
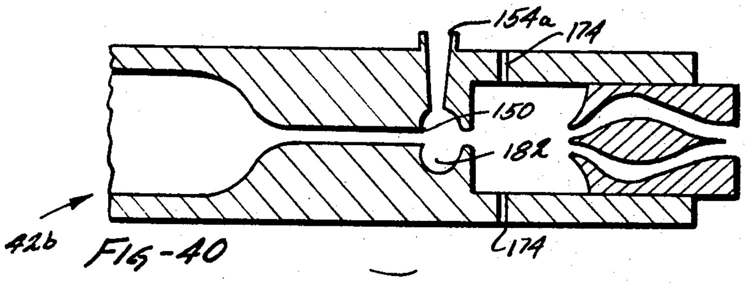
FIGURE 40 is a longitudinal cross-sectional view, showing somewhat diagrammatically, a demodulator similar to that shown in FIGURE 39 which employs a pressure-disturbance mode.

The demodulator means 42 and 42a operate on the velocity-disturbance mode. A demodulator means 42b employing the pressure-disturbance mode is shown in FIGURE 40 and is identical to the demodulator means 42a except that the waveguide or horn 154 is replaced with a waveguide 154a which communicates with a cavity 182 immediately downstream of the channel exit 150. Also, the bias passage 176 is eliminated. The cavity 182 is preferably of a minimum volume to insure good frequency response. Although an anti-feedback plate is not shown, improved performance is obtained if a plate identical to that shown in FIGURE 39 is used.

Although the modulator means 16 and the demodulator means 42 are in themselves novel as fluid devices, it is the coupling of the two that makes the novel pure fluid amplifier. As illustrated in FIGURE 1, the amplifier is useful as a communication device, not only for speech, but for acoustic information in general. There are many ways of connecting the system together depending on the application. The connecting link heretofore referred to as the transmission line or media 40 (FIGURE 2) is one example. When the transmission line is made extremely short, a unified amplifier, such as the one designated 190 in FIGURE 41, may be produced. In such a device, the output 87 is an amplified reproduction of the input 85. The modulator 16i is essentially that of FIGURE 22 and the demodulator 42c similar to that previously described in connection with FIGURE 39.

Figures 41, 42, 43:
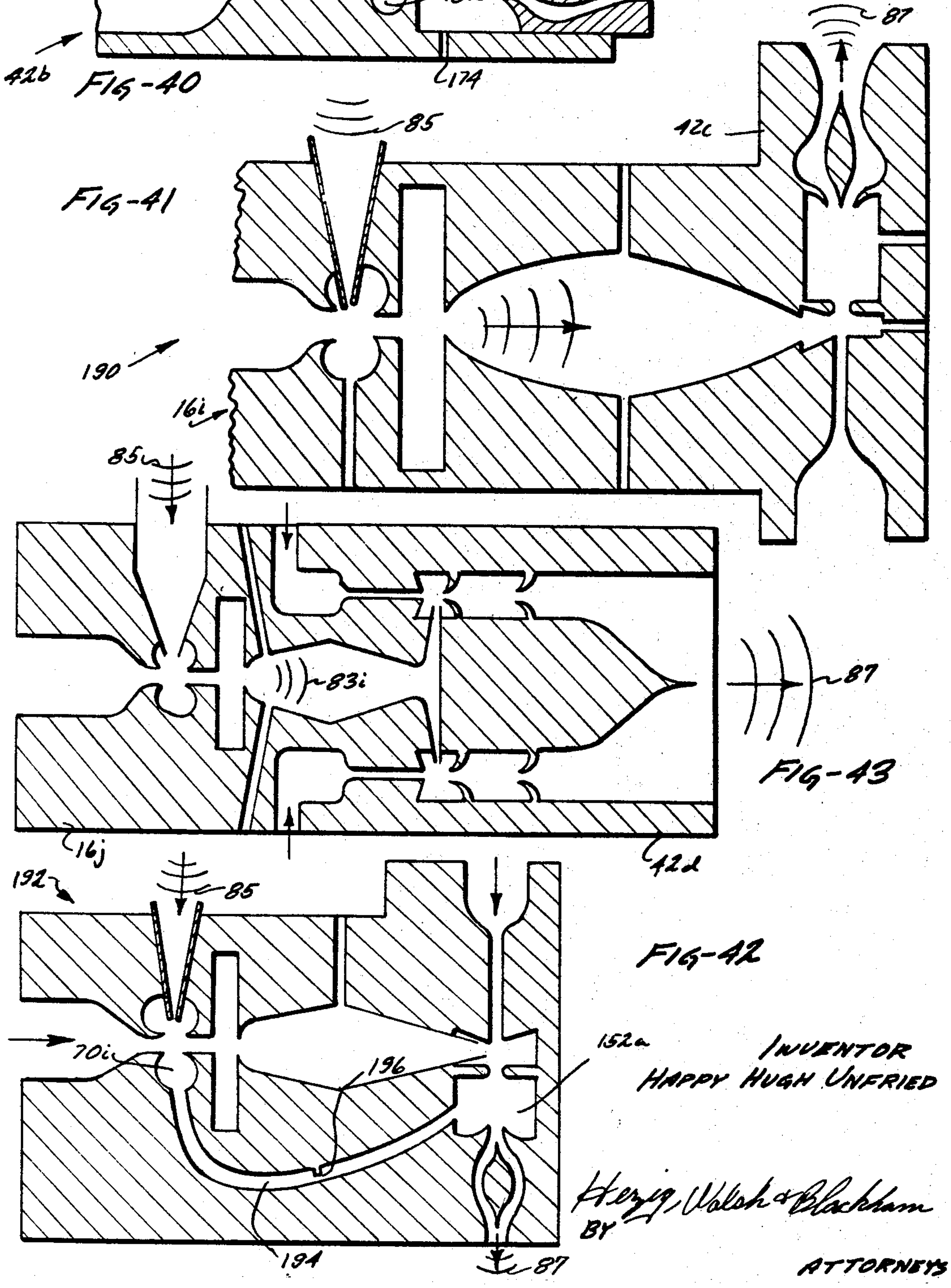
FIGURE 41 is a partial cross-sectional view of a unified amplifier of the present invention.
FIGURE 42 is a cross-sectional view of a device of the present invention which includes a negative feedback system.
FIGURE 43 is a cross-sectional view of a device of the present invention wherein a demodulator means is connected in parallel with the signal from a modulator means for increasing the power gain of the device.

In the amplifier 192 shown in FIGURE 42, negative feedback, as commonly practiced in the field of electronics, is employed. The signal in vortex chamber 152a is essentially out of phase with the input signal 85 and hence a portion of this signal is conducted back to the input chamber 70i by way of a conduit or waveguide 194 which includes a means, such as a variable orifice or acoustic resistance, indicated at 196, for attenuating the signal.

For obtaining positive feedback the waveguide 194 is connected to the output of the amplifier 192 where signal 87 emerges.

FIGURE 43 illustrates a way of increasing the power gain by having demodulator means 42d connected in parallel with the signal 83i from modulator means 16j. The limiting number of demodulators which can be directly coupled to a single modulator is a function of the general energy level of the modulating signal. In general, a dozen demodulators connected to a single large modulator is quite practical.

While the particular pure fluid amplifiers and communication devices herein shown and described in detail are fully capable of attaining the objects and providing the advantages hereinbefore stated, it is to be understood that they are merely illustrative of the presently preferred embodiments of the invention and that no limitations are intended to the details of construction or design herein shown other than as defined in the appended claims.

What is claimed is:

1. A pure fluid wave transmitter, comprising: means for establishing a free fluid jet discharging into an ambient fluid medium; means for modulating flow characteristics of said jet by a signal wave within a predetermined frequency range; means for oscillating said flow characteristics of said jet at a carrier frequency higher than said range to thereby propagate a modulated elastic carrier wave in said ambient medium, said means for oscillating said flow characteristics includes resonant cavity means, resonant at said carrier frequency.

2. A transmitter as defined in claim 1 wherein said free fluid jet is sound-sensitive; said modulating means comprising means for directing sound waves against said jet.

3. A transmitter as defined in claim 1 wherein said resonant cavity surrounds said jet; said modulating means comprising directing means for directing elastic sound waves into said cavity.

4. A transmitter as defined in claim 3 wherein said directing means comprises conduit means for directing said sound waves against one side of said jet, substantially normal to the direction of flow thereof, whereby to produce velocity disturbances in said jet.

5. A transmitter as defined in claim 3 wherein said directing means comprises a passageway opening into said cavity whereby said sound waves produce pressure disturbances around the periphery of said jet.

6. A transmitter as defined in claim 5 including a flexible diaphragm across said passageway thereby forming a blocking compliance sealing said cavity.

7. A transmitter as defined in claim 1 including wave directing means comprising reflector means adjacent said jet for directing said modulated carrier wave in a predetermined direction in said ambient medium.

8. A transmitter as defined in claim 7 wherein said wave directing means comprises a hollow tube extending from said jet in said predetermined direction and containing said ambient fluid medium.

9. A pure fluid amplifier, comprising: a modulator having means for establishing a free fluid jet discharging into an ambient fluid medium, means for modulating flow characteristics of said jet by an acoustic signal wave within a predetermined frequency range, and means for oscillating said flow characteristics of said jet at a carrier frequency higher than said range to thereby propagate a modulated elastic carrier wave in said ambient medium; means for directing said modulated carrier wave from said modulator toward said demodulator, and horn means at said demodulator for receiving said directed wave; and said demodulator means responsive to said modulated elastic carrier wave for demodulating the same to reproduce said signal in said predetermined frequency range as an elastic sound wave in said ambient fluid medium.

10. An amplifier as defined in claim 9 including means for directing a portion of said elastic sound wave back to said modulator to combine with said acoustic signal wave and thereby control the gain of said amplifier.

11. An amplifier as defined in claim 9 wherein said demodulator comprises means for establishing a second free fluid jet discharging into an ambient fluid medium and being sensitive to elastic waves in said predetermined frequency range; and means for directing said modulated carrier wave to said second jet whereby flow characteristics of said second jet are modulated in said predetermined frequency range and elastic waves reproducing said signal waves are propagated thereby in said ambient medium.

12. A demodulator for demodulating an elastic carrier wave travelling in an ambient fluid medium and modulated by a signal wave in a predetermined frequency range, comprising: means for establishing a free fluid jet discharging into an ambient fluid medium and sensitive to acoustic waves in said predetermined frequency range; and directing means for directing said travelling wave against said jet to modulate flow characteristics thereof within said predetermined frequency range and corresponding to said signal wave whereby said jet reproduces said signal wave and propagates the same as an elastic wave in said ambient fluid medium, an orifice downstream from said directing means and through which said jet is directed, said orifice serving to sever from the periphery of said jet any turbulent vortex flow of fluid from said jet.

13. A demodulator as defined in claim 12 wherein the boundary of said orifice is defined by a relatively thin-edged orifice structure having its thin peripheral edge facing generally upstream of said jet.

14. A demodulator as defined in claim 12 having means for establishing a plurality of said jets in substantially parallel relation, there being a directing means for each jet, and means for combining the waves propagated by all said jets.

15. A demodulator as defined in claim 12 including means downstream of said orifice for reducing the velocity of the fluid flow of said jet to thereby minimize noise generation.

16. A demodulator as defined in claim 12 including means defining a vortex chamber surrounding said jet, said orifice being formed in a wall of said chamber, said directing means comprising a passageway leading into said chamber.

17. A demodulator as defined in claim 16 including a vent passage communicating with said chamber and venting the same to said ambient fluid.

18. A demodulator as defined in claim 16 including a plate extending across said chamber between said directing means and said orifice and having an opening therein through which said jet is directed to prevent said jet flow from oscillating in said chamber.

19. A two-stage modulator and wave transmitter for a pure fluid acoustic amplifier comprising:

first orifice means communicating with a fluid under pressure for establishing a free jet discharging into an ambient fluid medium;

cavity means for receiving said free jet from said first orifice means; second orifie means communicating with said cavity means downstream of said first orfice means for receiving said free jet therefrom;

wall means forming a resonator chamber in communication with said second orifice means downstream thereof for receiving the flow of fluid therefrom;

third orifice means in communication with said resonator chamber downstream thereof for receiving the flow of fluid therefrom and oscillating it within said chamber, whereby a steady elastic wave is generated in the form of a carrier wave;

means connected to said cavity means for acoustically modulating said oscillating fluid jet with a modulated signal in a frequency range lower than the frequency of said carrier wave, whereby said acoustic carrier wave is modulated; and horn means connected to said third orifice means for transmitting a modulated elastic carrier wave away from said modulator through said ambient fluid medium.

20. A two-stage modulator as stated in claim 19 including a passageway communicating with said cavity means to establish a bias leak therefrom for minimizing displacement of the axis of said free jet within said cavity means by the influx of said modulation signal.

21. A two-stage modulator as stated in claim 19 wherein said means for acoustically modulating said oscillating fluid jet comprises a passageway communicating with said cavity means and a diaphragm mounted in said cavity for forming a blocking compliance sealing said cavity means, whereby said modulation signal vibrates said diaphragm causing a pressure disturbance in said passageway which modulates said oscillating fluid jet for producing an amplitude modulated carrier wave.

References Cited

UNITED STATES PATENTS

| | | | |
|---|---|---|---|
| 2,755,767 | 7/1956 | Levavasseur | 137—81.5 |
| 3,122,165 | 2/1964 | Horton | 137—81.5 |
| 3,144,037 | 8/1964 | Cargill et al. | 137—81.5 |
| 3,158,166 | 11/1964 | Warren | 137—81.5 |
| 3,181,545 | 5/1965 | Murphy | 137—81.5 |
| 3,228,410 | 1/1966 | Warren et al. | 137—81.5 |
| 3,234,955 | 2/1966 | Auger | 137—81.5 |
| 3,262,466 | 7/1966 | Adams et al. | 137—81.5 |
| 3,273,377 | 9/1966 | Testerman et al. | 137—81.5 |
| 3,275,016 | 9/1966 | Wood | 137—81.5 |
| 3,285,264 | 11/1966 | Boothe | 137—81.5 |

SAMUEL SCOTT, *Primary Examiner.*